(12) United States Patent
Dalla Piazza

(10) Patent No.: US 7,939,995 B2
(45) Date of Patent: May 10, 2011

(54) PIEZOELECTRIC RESONATOR IN A SMALL-SIZED PACKAGE

(75) Inventor: Silvio Dalla Piazza, St-Imier (CH)

(73) Assignee: ETA SA Manufacture Horlogére Suisse, Grenchen (CH)

( * ) Notice: Subject to any disclaimer, the term of this patent is extended or adjusted under 35 U.S.C. 154(b) by 88 days.

(21) Appl. No.: 11/956,051

(22) Filed: Dec. 13, 2007

(65) Prior Publication Data
US 2009/0152987 A1 Jun. 18, 2009

(51) Int. Cl.
*H03H 9/21* (2006.01)
(52) U.S. Cl. ......... 310/370; 310/321; 310/348; 331/156
(58) Field of Classification Search .......... 310/321, 310/370, 348
See application file for complete search history.

(56) References Cited

U.S. PATENT DOCUMENTS

| | | | |
|---|---|---|---|
| 4,178,526 A * | 12/1979 | Nakamura et al. | 310/321 |
| 6,700,313 B2 * | 3/2004 | Dalla Piazza et al. | 310/370 |
| 6,812,622 B2 * | 11/2004 | Matsuyama et al. | 310/344 |
| 7,084,556 B1 * | 8/2006 | Dalla Piazza et al. | 310/370 |
| 2003/0067248 A1 | 4/2003 | Dalla Piazza et al. | |
| 2006/0279176 A1 * | 12/2006 | Dalla Piazza et al. | 310/348 |
| 2007/0228891 A1 * | 10/2007 | Tanaya | 310/348 |

OTHER PUBLICATIONS

Search Report issued in corresponding application No. EP 07123177, completed May 26, 2008.

* cited by examiner

*Primary Examiner* — Walter Benson
*Assistant Examiner* — Bryan P Gordon
(74) *Attorney, Agent, or Firm* — Griffin & Szipl, P.C.

(57) ABSTRACT

The packaged piezoelectric resonator comprises a case (170; 270) with a lid (140; 240) and a piezoelectric resonator element (110) housed in said case, The piezoelectric resonator element includes a planar tuning-fork-shaped part with two parallel vibrating arms (112, 114), and an additional attachment arm (118) intended for fixing the resonator element (110) to the bottom (172) of the case (170). The inside surface of the lid (140, 240) is stepped in such a way as to form a first portion (142) where the lid has a first thickness and a second portion (144) where the lid has a second thickness substantially greater than the first thickness, the first portion (142) extending at least over distal end portions (166, 168) of the vibrating arms (112, 114), and the second portion (144) extending at least over a part of the attachment arm (118).

17 Claims, 5 Drawing Sheets

Fig. 3B
Fig. 4
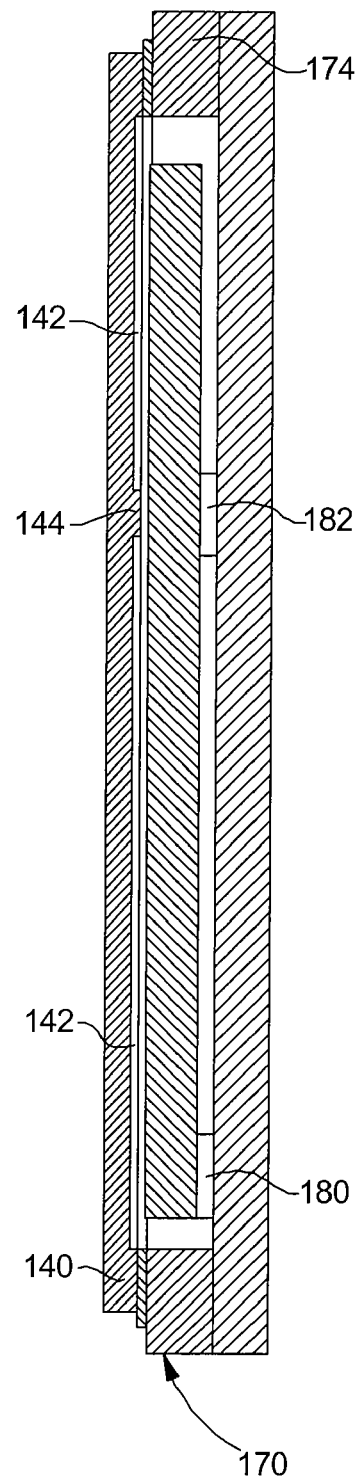
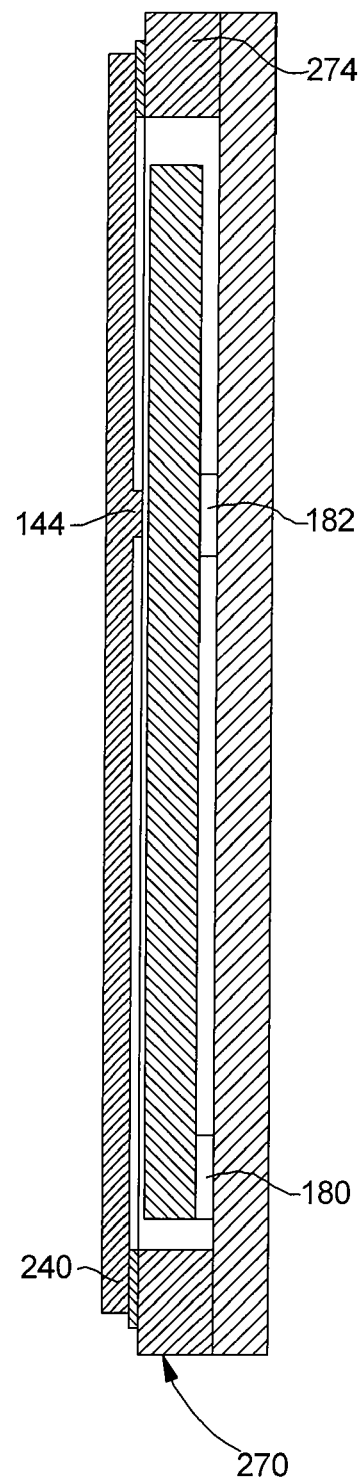

PIEZOELECTRIC RESONATOR IN A SMALL-SIZED PACKAGE

FIELD OF INVENTION

The present invention concerns packaged piezoelectric resonators or, in other words, devices formed each by a piezoelectric resonator and the case in which it is housed. The present invention more particularly concerns packaged piezoelectric resonators of small dimensions which are most often used for making frequency generators in particular for portable electronic equipment, in numerous fields such as horology, information technology, telecommunications and the medical field.

BACKGROUND OF THE INVENTION

Such a packaged resonator of small dimensions has been disclosed in the prior art document U.S. Pat. No. 7,084,556 filed in the name of the Assignee, and which is incorporated herewith by way of reference. Resonator 10, represented on FIG. 1, is intended to be mounted in a package. It includes a tuning fork shaped part with two parallel arms 12, 14 connected to each other by a linking part 16 and carrying electrodes 20, 22 to make them vibrate, these electrodes being connected to connecting pads 28, 30 intended to be electrically connected to the exterior of the case.

FIG. 2A is a top view of a known package (shown with its lid off) for receiving a piezoelectric resonator of the type corresponding to the field of the invention. It is understood that the size of the package depends on the general shape of the resonator, which may vary according to the embodiment considered. Package 70 of parallelepiped shape includes a case formed by a flat bottom 72 and four sides 74, and a lid (not shown). Two conductive elements, such as thin conductive layers, studs or bumps 78 and 80, are arranged on the flat bottom 72 for contacting the connecting pads 28, 30 of the resonator 10 (FIG. 1). After the resonator 10 has been mounted in the case 70, the lid can be fastened on by vacuum soldering its edges onto the sides 74 of the case. This can be done by heating and pressure, by means of a soldering frame (not shown). In a known manner, the flat bottom 72 and the four sides 74 of the case of FIG. 2A can be formed by etching layers of ceramic. If the lid for the case is not made of ceramic like the rest of the package, it can be made for example from metal, glass or silicon.

One of the problems with most conventional resonators is that they are designed to be bonded to a support substrate at one of their ends only. With such a design, it is difficult to guarantee that the planar tuning-fork-shaped part of the resonator is properly positioned and aligned parallel to the surface of the support substrate. In case of misalignment, there is a risk that the vibrating arms of the resonator will collide with the surface of the support substrate or with the lid of the package. In order to prevent such an outcome, sufficient clearance must be provided above and below the resonator. This requirement for clearance severely limits the possibility of designing ever thinner and more compact packaged piezoelectric resonators.

Prior patent document U.S. Pat. No. 7,084,556 partly solves the above problem by providing an improved tuning fork resonator including an additional central attachment arm 18 (FIG. 1) connected to linking part 16 and located between arms 12, 14 of the tuning fork shaped part, substantially equidistant from them. As depicted in FIG. 1, a base part 62 can further be formed at the end of the attachment arm opposite the linking part 16. According to the depicted example, the base part extends beyond vibrating arms 12 and 14 and preferably carries the connecting pads 28, 30 of the resonator. The resonator 10 is mounted in its case by bonding the base part 62 and/or the attachment arm 18, through at least one attachment point, to the bottom of the case. The base part is preferably used both for bonding resonator 10 to the inside its packaging, and for electrically connecting electrodes 20, 22 to conductive elements inside the packaging (not shown).

The provision for a resonator with at least one attachment arm disclosed by patent document U.S. Pat. No. 7,084,556 amounts to a considerable improvement. However, a need subsists for an even slimmer and more compact packaged piezoelectric resonator. Therefore, one aim of the present invention is to further improve the slimness and the compactness of packaged piezoelectric resonators.

One way of achieving this result is to reduce the thickness of the lid of the package housing the piezoelectric resonator. However, the inside of the package is usually maintained under vacuum conditions. Therefore, the lid is submitted to considerable pressure exerted by the atmosphere on the outside of the package. In many cases, the atmospheric pressure will be enough to cause the lid to sag substantially. As the clearance between the vibrating arms and the lid should be minimal, this sagging of the lid can cause collisions between the vibrating arms and the underside of the lid.

SUMMARY OF THE INVENTION

One aim of the invention is to limit the sagging of the lid so that sufficient clearance is maintained between the vibrating arms and the underside of the lid.

For this purpose, the invention concerns a packaged piezoelectric resonator according to the appended claim 1.

One will understand that, according to the present invention, the inside surface of the lid is stepped and comprises a portion of substantially greater thickness extending over the attachment arm. Therefore, any significant sagging of the lid causes this thicker portion of the lid it to come to rest on the attachment arm. Any further sagging of the lid is thus prevented. Further, the portion of the lid extending over the distal end portions of the vibrating arms is of lesser thickness. This insures that the clearance remains sufficient to avoid any risk of the vibrating arms colliding with the underside of the lid.

BRIEF DESCRIPTION OF THE DRAWINGS

Other features and advantages of the invention will appear upon reading the following description which refers to the annexed drawings in which:

FIG. 3b is a side view of the packaged resonator of FIG. 3a;

FIG. 4 is a side view of a packaged resonator corresponding to an alternative embodiment of the present invention.

DETAILED DESCRIPTION OF THE INVENTION

Figure 3A:
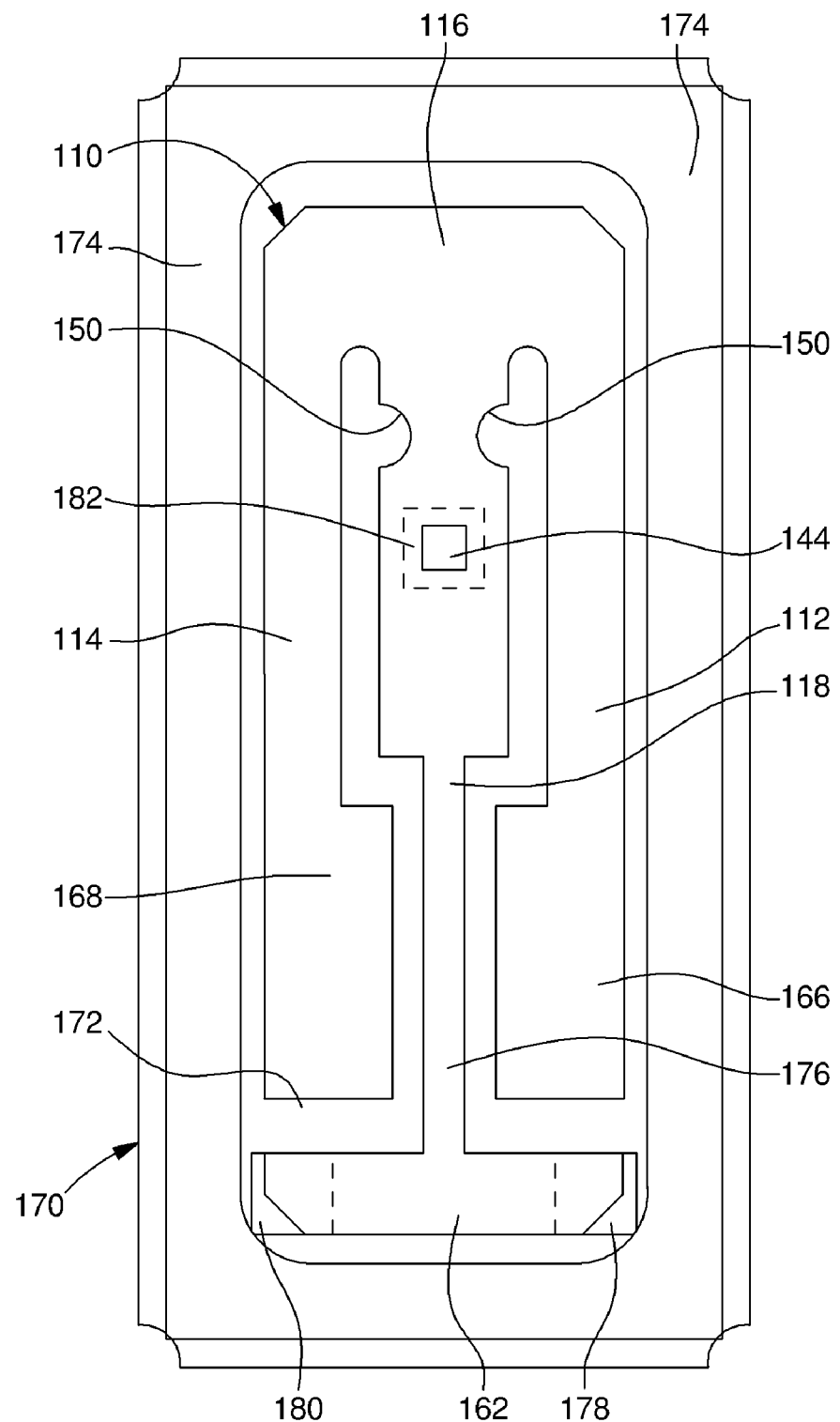
FIG. 3a is a top view of a piezoelectric resonator of FIG. 2B mounted in a package according to another embodiment of the present invention.

In the embodiment shown in relation with FIGS. 3a, and 3b, the resonator according to the invention, designated by the reference numeral 110, includes a tuning fork shaped part with two vibrating arms 112 and 114 joined by a linking part 116 to which a central attachment arm 118, located between arms 112 and 114 and parallel thereto, is connected. The whole assembly is made from a single piece of quartz.

As visible in FIG. 3a, the central arm 118 is slightly longer than the vibrating arms 112 and 114. The distal end of the central arm widens into a base part 162 extending beyond the vibrating arms. The base part 162 is used both for fixing resonator 110 to the bottom of its packaging and for electrically connecting the driving electrodes (not shown) of the resonator to conductive studs or bumps 178 and 180 formed inside the packaging.

The distal end of each of the vibrating arms 112 and 114 widens into a flipper (166 and 168 respectively) which is almost twice as wide as the rest of the vibrating arm. In order to reduce the overall width of the resonator, the rectangular shaped flippers are preferably not arranged symmetrically with respect to the longitudinal axis of the vibrating arms. Rather, as shown in FIG. 3a, the flippers 166, 168 can be offset towards the central arm 118. In this case, in order to provide sufficient lateral clearance between the flippers 166, 168 and the central arm 118, the central arm comprises a narrowed portion 176. As shown in FIG. 3a, the narrowed portion 176 extends between the flippers 166 and 168. It is known from the prior art that an advantage of providing the vibrating arms with flippers is that the flipper length can be subtracted from the overall length of the vibrating arm without modifying the resonator properties and therefore the resonator length can be reduced accordingly.

As can be seen in FIGS. 3a and 3b, the attachment arm 118 is positioned on top of fixing stud or bump 182 formed on the flat bottom of the package 170. As previously mentioned, resonator 110 is also fixed to conductive studs 178 and 180. One will therefore understand that, in the present embodiment, studs 178, 180 and 182 form a tripod mounting for fixing the resonator 110 inside the package 170. This tripod mounting also provides sufficient clearance between the vibrating arms and the flat bottom 172. The attachment arm 118 and the base part 162 may for example be glued or welded to the three studs. As visible in FIG. 3a, the portion of the attachment arm 118 lying between fixing stud 182 and linking part 116 is preferably at least one and a half times as wide as one of the vibrating arms. Further, in the present embodiment, decoupling means 150 are arranged on the central arm near linking part 116. These decoupling means are provided in order to mechanically decouple central attachment arm 118 from vibrating arms 112 and 114. As shown, the decoupling means may be implemented in the form of notches 150 on either side of central arm 118. The decoupling means are arranged between fixing stud 182 and linking part 116. Preferably nearer linking part 116.

Figure 1:
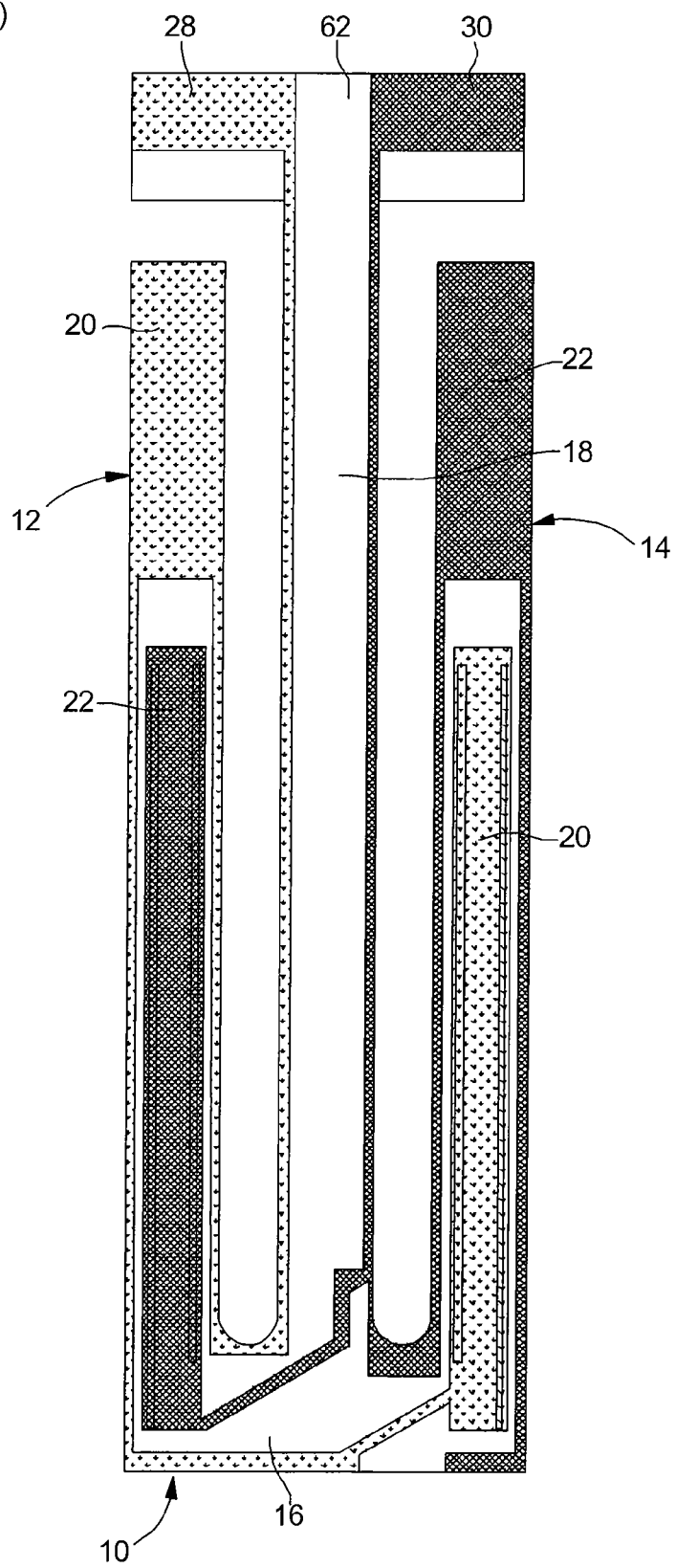
FIG. 1 is a prior art example of a piezoelectric resonator of the type corresponding to the field of the present invention.
Figure 2A:
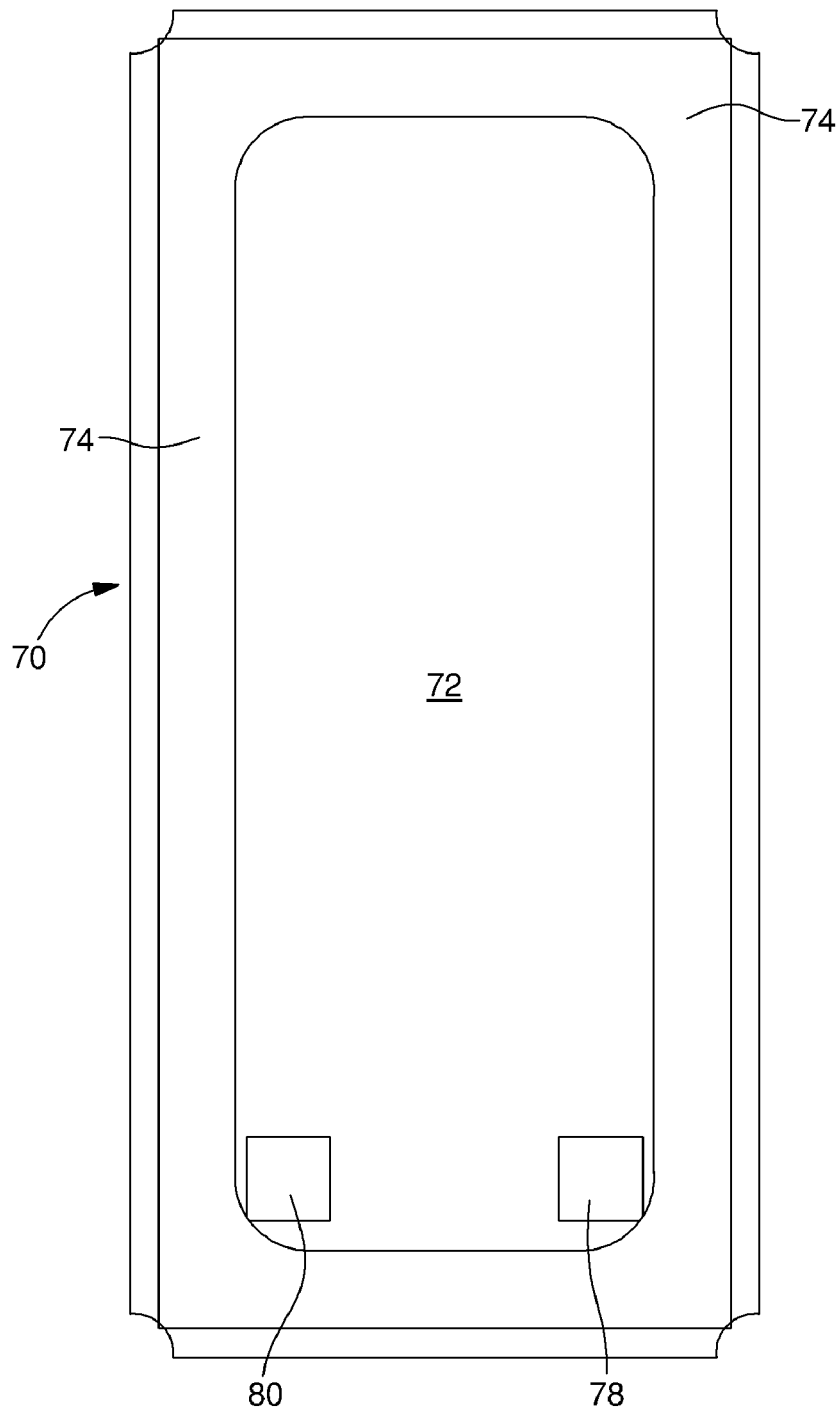
FIG. 2A is a top view of a suitable package for receiving a piezoelectric resonator of the type shown in FIG. 1.
Figure 2B:
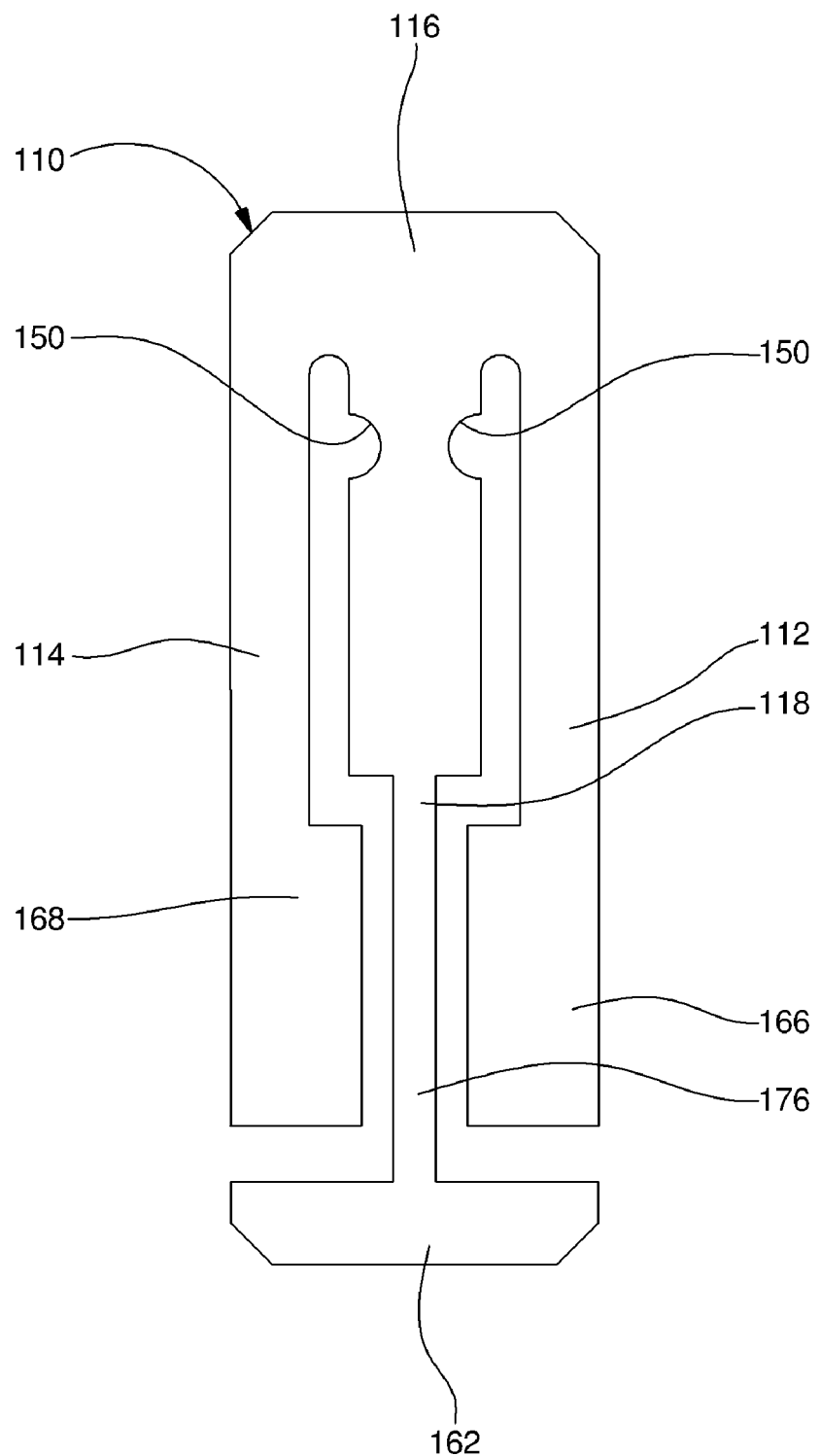
FIG. 2B is a top view of a piezoelectric resonator according to an embodiment of the present invention.

As is usual with this type of resonator, vibrating arms 112 and 114 carry two groups of electrodes (not shown), which can be arranged and connected to each other in a similar fashion as the electrode groups 20 and 22 shown in FIG. 1. The two electrode groups are further connected to two conductive connection pads (not shown) formed on the back of base part 162. These connection pads are arranged to make contact with conducting studs 178 and 180 respectively.

As known from the prior art, in order to reduce the amount of energy consumed by the resonator, at least one groove (not shown) can further be formed on at least one of the front or rear side of each vibrating arm. The presence of grooves allows producing an excitation electrical field which is more homogeneous and locally more intense and for which vibration loss at the arms is low even when the size of the vibrating piece is miniaturized.

As previously mentioned, the piezoelectric resonator 110 shown in FIGS. 3a and 3b is fixedly mounted in package 170. The actual size of the package is preferably chosen according the size and general shape of the resonator, which may vary according to the embodiment considered. Package 170 of parallelepiped shape includes a case formed by a flat bottom 172 and four sides 174, and a lid 140 (shown in FIG. 3b). The lid has an edge via which it is vacuum soldered, on sides 174 of the main part, by heating and pressure, by means of a soldering frame (not shown), after the resonator has been mounted in case 170. The height of the three studs 178, 180 and 182 supporting the resonator 110 is chosen so that the vibrating arms of the resonator may vibrate freely inside case 170.

The side view of FIG. 3b shows the packaged resonator of FIG. 3a with its top or lid 140 on. As can be seen, the lid is not of uniform thickness. A first portion of the lid has a first thickness, while the rest of the lid has a second thickness, which is substantially greater than the first thickness. The portion of the lid having the first thickness forms a large recessed area 142 on the inside of the lid. The purpose of using a lid comprising portions of different thickness is to reconcile the contradictory requirements of providing sufficient clearance above the vibrating arms, and of reducing the overall height of package 170. In the case of a lid made of glass, of silicon, or of metal, the recessed portion 142 can be formed by removing some of the material of the lid by etching, chemical etching, Deep reactive Ion Etching, or even by drop forging in the case of a lid made of metal.

As shown in FIG. 3b, according to the present embodiment, the recessed portion 142 covers practically the entire area facing the flat bottom 172, except for a bulging portion or protrusion 144. It should be understood however that, according to alternative embodiments, instead of extending over the entire area facing the flat bottom 172, the recessed portion 142 could be limited to the area directly facing the vibrating arms 112 and 114, or even limited to the area directly facing the distal end portions of these vibrating arms.

As shown in FIG. 3a, the above mentioned bulging portion or protrusion 144 extends on the inside of the lid 140 in a location facing the central arm 118. Preferably, the protrusion 144 is arranged so as to be located directly across from the attachment point where central arm 118 is attached to fixing stud 182.

The inside of the package depicted in FIGS. 3a and 3b is intended to be maintained under vacuum conditions. When the lid 140 is made thin in order to produce a slimmer package, the atmospheric pressure on the outside of the lid 140 can cause it to sag substantially. According to the present invention, this problem is cured by providing a bulging portion or a protrusion 144 extending downwards from the inside surface of the lid. When the lid sags, this bulging portion comes to rest on top of the central arm 118. The lid thus being supported by the central arm, it is prevented from sagging any further. As the distal end portions of the vibrating arms are positioned across from the recessed portion 142, the clearance between the vibrating arms and the lid stays sufficient to ensure that no collision occurs.

FIG. 4 shows still another embodiment of the packaged resonator according to the present invention. According to this particular embodiment, lid 240 does not comprise a recessed area. Rather, the entire lid has a reduced thickness (except for the protrusion 144). According to this embodiment, in order to provide sufficient clearance for the vibrating arms, the sides 274 of the package are made slightly higher than the sides 174 of the package shown in FIG. 3.

Having described the invention with regard to certain specific embodiments, it is to be understood that these embodiments are not meant as limitations of the invention. Indeed, various modifications, adaptations and/or combination between embodiments may become apparent to those skilled in the art without departing from the scope of the annexed claims. In particular, patent document U.S. Pat. No. 7,084, 556 describes ten different packaged resonators of the type corresponding to the field of the present invention. The present invention could be routinely implemented with any of these different packaged resonators.

The invention claimed is:

1. A packaged piezoelectric resonator comprising:
   (i) a case with a flat bottom, four sides and a lid; and
   (ii) a piezoelectric resonator element housed inside the case under vacuum,
   wherein the piezoelectric resonator element includes:
      (a) a planar tuning-fork-shaped part with two parallel vibrating arms connected to each other by a linking part; and
      (b) an attachment arm extending from the linking part along the plane of the planar tuning-fork-shaped part, wherein the attachment arm is fixedly attached to the bottom of the case through at least one attachment point, and at least a main portion of the attachment arm is arranged in between the vibrating arms, parallel and side by side with the vibrating arms,
   wherein the inside surface of the lid is stepped in such a way as to form a first portion where the lid has a first thickness and a second portion where the lid has a second thickness substantially greater than the first thickness, wherein the first portion extends at least over distal end portions of the vibrating arms, and the second portion extends over a part of the attachment arm, and wherein the second portion rests on the attachment arm.

2. The packaged piezoelectric resonator according to claim 1, wherein said attachment arm is fixedly attached to the bottom of said case through a central attachment point located between said vibrating arms.

3. The packaged piezoelectric resonator according to claim 1, wherein a distal end of the attachment arm widens into a base part opposite the linking part and extending beyond the vibrating arms, said base part being fixedly attached to the bottom.

4. The packaged piezoelectric resonator according to claim 1, wherein the said first portion covers substantially the entire area facing the bottom, except for a bulging portion or protrusion facing a part of the attachment arm.

5. The packaged piezoelectric resonator according to claim 4, wherein said protrusion faces said central attachment point.

6. The packaged piezoelectric resonator according to claim 1, wherein said first portion forms two recesses in the inside portion of the lid, said recesses each facing one of said vibrating arms.

7. The packaged piezoelectric resonator according to claim 6, wherein said recesses each directly face the distal end of one of the vibrating arms.

8. The packaged piezoelectric resonator according to claim 2, wherein the attachment arm comprises decoupling means, said decoupling means being arranged between said central attachment point and said linking part.

9. The packaged piezoelectric resonator according to claim 8, wherein said decoupling means are formed by notches on either side of the attachment arm.

10. The packaged piezoelectric resonator according to claim 2, wherein the said first portion covers substantially the entire area facing the bottom, except for a bulging portion or protrusion facing a part of the attachment arm.

11. The packaged piezoelectric resonator according to claim 3, wherein the said first portion covers substantially the entire area facing the bottom, except for a bulging portion or protrusion facing a part of the attachment arm.

12. The packaged piezoelectric resonator according to claim 2, wherein said first portion forms two recesses in the inside portion of the lid, said recesses each facing one of said vibrating arms.

13. The packaged piezoelectric resonator according to claim 3, wherein said first portion forms two recesses in the inside portion of the lid, said recesses each facing one of said vibrating arms.

14. A packaged piezoelectric resonator comprising:
    (i) a case with a flat bottom, four sides and a lid; and
    (ii) a piezoelectric resonator element housed in the case,
    wherein the piezoelectric resonator element includes:
       (a) a planar tuning-fork-shaped part with two parallel vibrating arms connected to each other by a linking part; and
       (b) an attachment arm extending from the linking part along the plane of the planar tuning-fork-shaped part, wherein the attachment arm is fixedly attached to the bottom of the case through at least one attachment point, and at least a main portion of the attachment arm is arranged in between the vibrating arms, parallel and side by side with the vibrating arms,
    wherein the inside surface of the lid is stepped in such a way as to form a first portion where the lid has a first thickness and a second portion where the lid has a second thickness substantially greater than the first thickness, wherein the first portion extends at least over distal end portions of the vibrating arms, and the second portion extends over a part of the attachment arm,
    wherein the attachment arm is fixedly attached to the bottom of the case through a central attachment point located between the vibrating arms,
    wherein a distal end of the attachment arm widens into a base part opposite the linking part and extending beyond the vibrating arms, the base part being fixedly attached to the bottom, and
    wherein the base part comprises two distal attachment points with the bottom of the case, and wherein the two distal attachment points form, together with a central attachment point located between the vibrating arms, a tripod mounting for the resonator.

15. The packaged piezoelectric resonator according to claim 14, wherein the distal end portion of each of the vibrating arms widens into a flipper.

16. The packaged piezoelectric resonator according to claim 15, wherein one flipper is L-shaped and the other flipper is inverted L-shaped.

17. A packaged piezoelectric resonator comprising:
    (i) a case with a flat bottom, four sides and a lid; and
    (ii) a piezoelectric resonator element housed in the case,
    wherein the piezoelectric resonator element includes:

(a) a planar tuning-fork-shaped part with two parallel vibrating arms connected to each other by a linking part; and
(b) an attachment arm extending from the linking part along the plane of the planar tuning-fork-shaped part, wherein the attachment arm is fixedly attached to the bottom of the case through at least one attachment point, and at least a main portion of the attachment arm is arranged in between the vibrating arms, parallel and side by side with the vibrating arms, wherein the inside surface of the lid is stepped in such a way as to form a first portion where the lid has a first thickness and a second portion where the lid has a second thickness substantially greater than the first thickness, wherein the first portion extends at least over distal end portions of the vibrating arms, and the second portion extends over a part of the attachment arm, wherein a distal end of the attachment arm widens into a base part opposite the linking part and extending beyond the vibrating arms, said base part being fixedly attached to the bottom, and wherein said base part comprises two distal attachment points with the bottom of said case, and wherein said two distal attachment points form, together with a central attachment point located between said vibrating arms, a tripod mounting for said resonator.

* * * * *